United States Patent
Yang

(10) Patent No.: US 12,176,218 B2
(45) Date of Patent: Dec. 24, 2024

(54) BEVEL ETCHING METHOD

(71) Applicant: NANYA TECHNOLOGY CORPORATION, New Taipei (TW)

(72) Inventor: Sheng-Hui Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 288 days.

(21) Appl. No.: 17/562,193

(22) Filed: Dec. 27, 2021

(65) Prior Publication Data
US 2023/0207327 A1  Jun. 29, 2023

(51) Int. Cl.
*H01L 21/311* (2006.01)
*H01L 21/027* (2006.01)

(52) U.S. Cl.
CPC .... *H01L 21/31116* (2013.01); *H01L 21/0273* (2013.01); *H01L 21/31144* (2013.01)

(58) Field of Classification Search
CPC ........... H01L 21/31116; H01L 21/0273; H01L 21/31144; H01L 21/0337; H01L 21/3065
See application file for complete search history.

(56) References Cited

U.S. PATENT DOCUMENTS

| | | | |
|---|---|---|---|
| 5,376,503 A | 12/1994 | Audett et al. | |
| 2005/0020087 A1 | 1/2005 | Wagner et al. | |
| 2005/0244756 A1 | 11/2005 | Clarner | |
| 2006/0223898 A1* | 10/2006 | Economy | C08G 61/02 521/61 |
| 2007/0026670 A1 | 2/2007 | Schuehrer et al. | |
| 2015/0001682 A1* | 1/2015 | Liu | H01L 23/562 438/763 |
| 2020/0002568 A1 | 1/2020 | Yao et al. | |
| 2020/0058746 A1* | 2/2020 | Wu | H01L 22/26 |

FOREIGN PATENT DOCUMENTS

TW  202025337 A  7/2020

OTHER PUBLICATIONS

Office Action mailed on Nov. 15, 2022 related to Taiwanese Application No. 111109654.
Office Action and Search Report mailed on Jul. 8, 2024 related to U.S. Appl. No. 17/562,633.

* cited by examiner

*Primary Examiner* — Jaehwan Oh
*Assistant Examiner* — John M Parker
(74) *Attorney, Agent, or Firm* — Xuan Zhang

(57) ABSTRACT

A bevel etching method includes forming a target layer over a semiconductor substrate, and forming an energy-sensitive layer over the target layer. The method also includes performing an energy treating process to form a treated portion in the energy-sensitive layer. The treated portion is in a peripheral region. The method further includes removing the treated portion such that a remaining portion of the energy-sensitive layer is in a central region surrounded by the peripheral region, and transferring a pattern of the remaining portion of the energy-sensitive layer to the target layer.

10 Claims, 20 Drawing Sheets

BEVEL ETCHING METHOD

TECHNICAL FIELD

The present disclosure relates to a bevel etching method.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as pattern peeling and/or collapse occurred over the bevel portion of the semiconductor substrate. The peeled and/or collapsed patterns may be released from the semiconductor substrate and become particles. Such particles may be reattached to the semiconductor substrate during the manufacturing processes, which reduces the yield of the semiconductor device. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device structure is provided. The method includes forming a target layer over a semiconductor substrate, and forming an energy-sensitive layer over the target layer. The method also includes performing an energy treating process to form a treated portion in the energy-sensitive layer. The treated portion is in a peripheral region. The method further includes removing the treated portion such that a remaining portion of the energy-sensitive layer is in a central region surrounded by the peripheral region, and transferring a pattern of the remaining portion of the energy-sensitive layer to the target layer.

In an embodiment, a bevel portion of the semiconductor substrate is covered by the treated portion. In an embodiment, the bevel portion of the semiconductor substrate is exposed after the target layer is etched. In an embodiment, the energy-sensitive layer includes a cross-linking compound having a cross-linking functional group. In an embodiment, the cross-linking functional group includes a double bond. In an embodiment, the treated portion is in direct contact with the target layer.

In an embodiment, the target layer is partially exposed after the treated portion is removed. In an embodiment, the pattern of the remaining portion of the energy-sensitive layer is transferred to the target layer by a dry etching process. In an embodiment, the method further includes removing the remaining portion of the energy-sensitive layer after the pattern of the remaining portion of the energy-sensitive layer is transferred to the target layer. In an embodiment, the energy treating process is an electron-beam (e-beam) writing process.

In another embodiment of the present disclosure, a method for preparing a semiconductor device structure is provided. The method includes forming a target layer over a semiconductor substrate, and forming an energy-sensitive layer over the target layer. The method also includes performing an energy treating process on the energy-sensitive layer to transform a portion of the energy-sensitive layer into a treated portion. An untreated portion of the energy-sensitive layer is surrounded by the treated portion. The method further includes removing the treated portion, and transferring a pattern of the untreated portion of the energy-sensitive layer to the target layer such that the semiconductor substrate is exposed.

In an embodiment, the treated portion of the energy-sensitive layer overlaps a bevel portion of the semiconductor substrate. In an embodiment, the untreated portion of the energy-sensitive layer does not overlap a bevel portion of the semiconductor substrate. In an embodiment, the treated portion penetrates through the energy-sensitive layer. In an embodiment, a bottom surface of the treated portion is higher than a top surface of the target layer. In an embodiment, the energy treating process is an electron-beam (e-beam) writing process.

In an embodiment, the method further includes forming a patterned hard mask over the energy-sensitive layer, and performing the energy treating process using the patterned hard mask as a mask. In an embodiment, a central region of the energy-sensitive layer is covered by the patterned hard mask. In an embodiment, the energy-sensitive layer includes a cross-linking compound having a cross-linking functional group. In an embodiment, the cross-linking functional group includes a double bond.

Embodiments of a method for preparing a semiconductor device structure are provided in the disclosure. The method includes sequentially forming a target layer and an energy-sensitive layer over a semiconductor substrate, and forming a treated portion in the energy-sensitive layer by performing an energy treating process. The method also includes removing the treated portion and transferring a pattern of a remaining portion of the energy-sensitive layer to the target layer such that the semiconductor substrate is exposed. In some embodiments, the treated portion of the energy-sensitive layer is in a peripheral region, and the remaining portion of the energy-sensitive layer is in a central region. Therefore, the materials directly over the bevel portion of the semiconductor substrate (i.e., the portion of the semiconductor substrate in the peripheral region) can be removed. As a result, the pattern peeling and/or collapse occurred over the bevel portion of the semiconductor substrate can be effectively reduced or prevented, and the yield of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
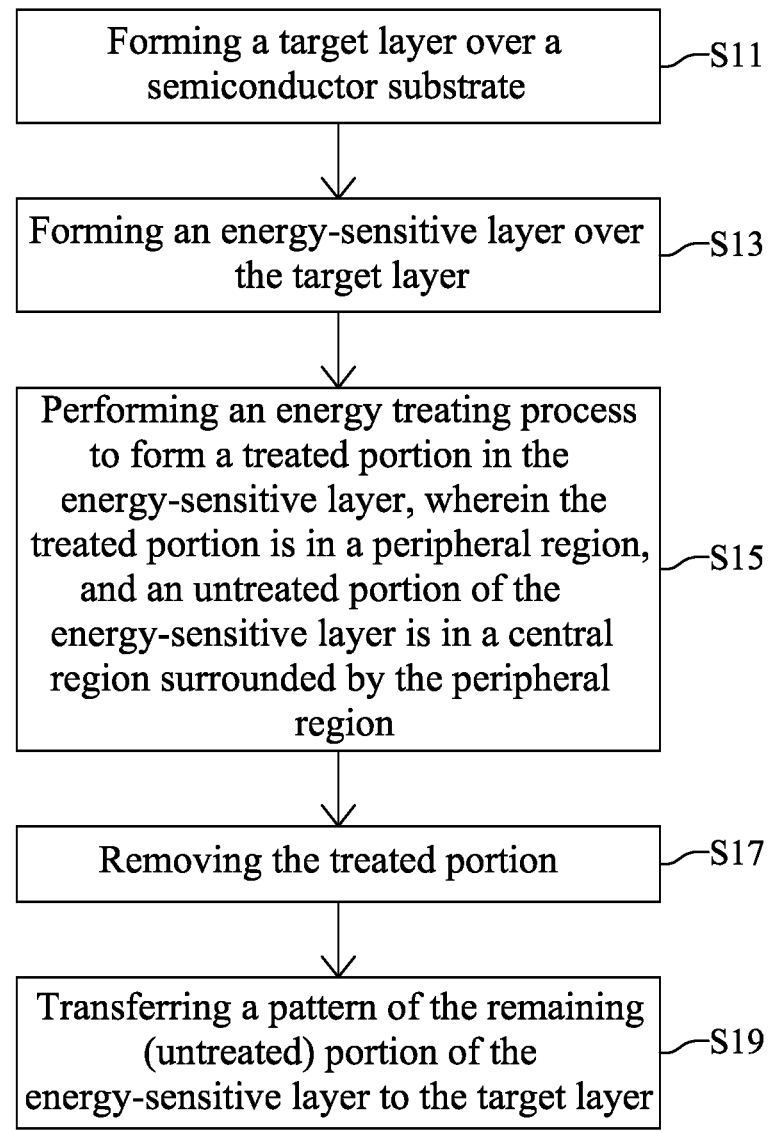
FIG. 1 is a flow diagram illustrating a method for preparing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device structure 100, and the method 10 includes steps S11, S13, S15, S17 and S19, in accordance with some embodiments. The steps S11-S19 of FIG. 1 are first introduced briefly and then elaborated in connection with following figures. As shown in FIG. 1, the method 10 begins at step S11 where a target layer is formed over a semiconductor substrate.

Next, at step S13, an energy-sensitive layer is formed over the target layer. In some embodiments, the energy-sensitive layer includes a cross-linking compound having a cross-linking functional group. In some embodiments, the cross-linking functional group includes a double bond. At step S15, an energy treating process is performed to form a treated portion in the energy-sensitive layer. In some embodiments, the treated portion is in a peripheral region, and an untreated portion is in a central region surrounded by the peripheral region. In some embodiments, the energy treating process is an electron-beam (e-beam) writing process.

Subsequently, at step S17, the treated portion is removed, and at step S19, the pattern of the remaining (untreated) portion of the energy-sensitive layer is transferred to the target layer. In some embodiments, the pattern is transferred by a dry etching process. In some embodiments, the bevel portion of the semiconductor substrate (i.e., the portion of the semiconductor substrate in the peripheral region) is exposed after the etching process.

Figure 2:
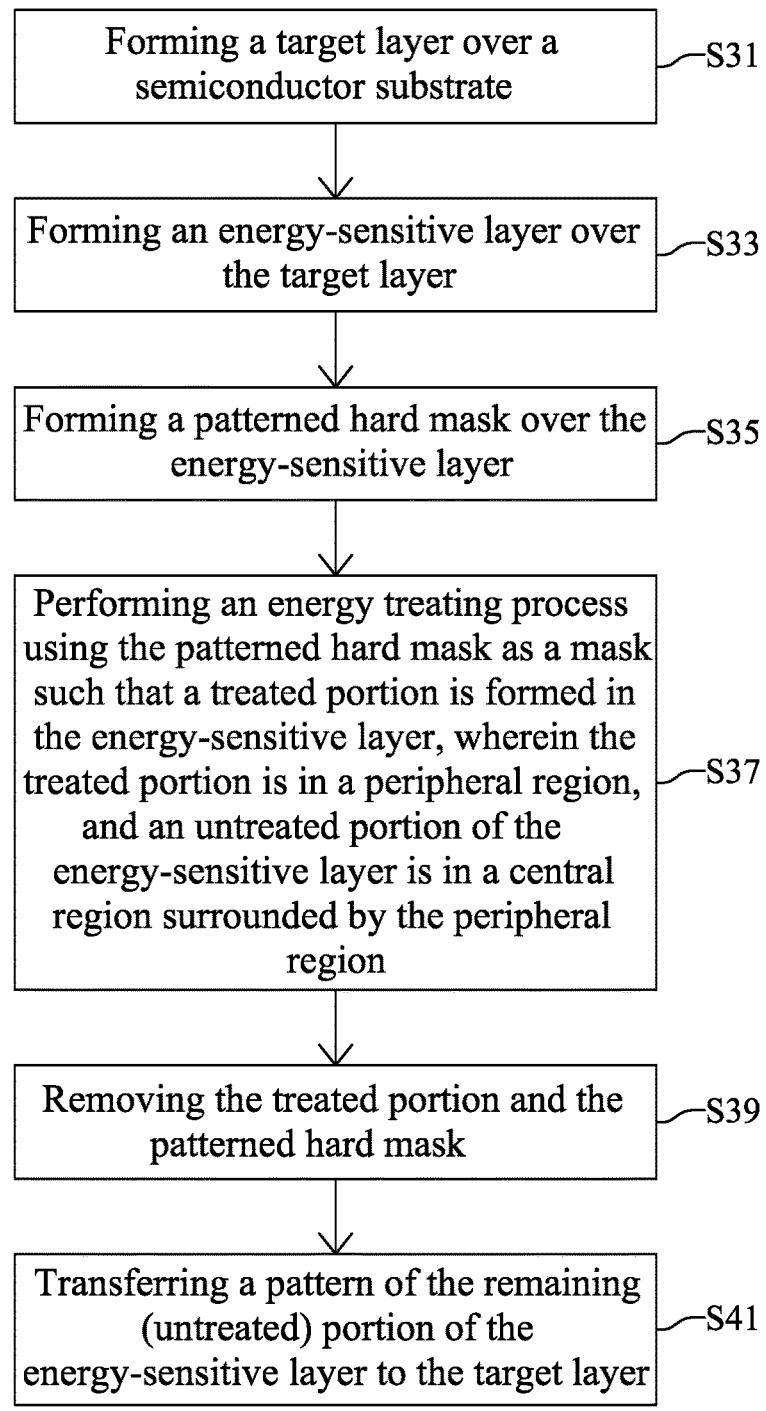
FIG. 2 is a flow diagram illustrating a method for preparing a semiconductor device structure, in accordance with some embodiments.

FIG. 2 is a flow diagram illustrating a method 30 for preparing a semiconductor device structure 100, and the method 30 includes steps S31, S33, S35, S37, S39 and S41, in accordance with some embodiments. The method 30 is similar to the method 10 illustrated in FIG. 1, except that a patterned hard mask is formed over the energy-sensitive layer, and the energy treating process is performed using the patterned hard mask as a mask. The steps S31-S41 of the method 30 are first introduced briefly and then elaborated in connection with following figures.

As shown in FIG. 2, the method 30 begins at step S31 where a target layer is formed over a semiconductor substrate, and at step S33, an energy-sensitive layer is formed over the target layer. The steps S31 and S33 correspond to the steps S11 and S13 of FIG. 1. In some embodiments, the energy-sensitive layer includes a cross-linking compound having a cross-linking functional group. In some embodiments, the cross-linking functional group includes a double bond.

Then, at step S35, a patterned hard mask is formed over the energy-sensitive layer. In some embodiments, the patterned hard mask covers a portion of the energy-sensitive layer in a central region, and exposes a portion of the energy-sensitive layer in a peripheral region surrounding the central region. At step S37, an energy treating process is performed using the patterned hard mask as a mask such that a treated portion is formed in the energy-sensitive layer. In some embodiments, the energy treating process is an e-beam writing process.

Following the step of S37, the treated portion of the energy-sensitive layer and the patterned hard mask are removed at step S39. The patterned hard mask and the treated portion may be removed separately or may be removed by the same process. Next, at step S41, the pattern of the remaining (untreated) portion of the energy-sensitive layer is transferred to the target layer, which corresponds to the step S19 of the method 10 shown in FIG. 1. In some embodiments, the pattern is transferred by a dry etching process. In some embodiments, the bevel portion of the semiconductor substrate (i.e., the portion of the semiconductor substrate in the peripheral region) is exposed after the etching process.

Figure 3:
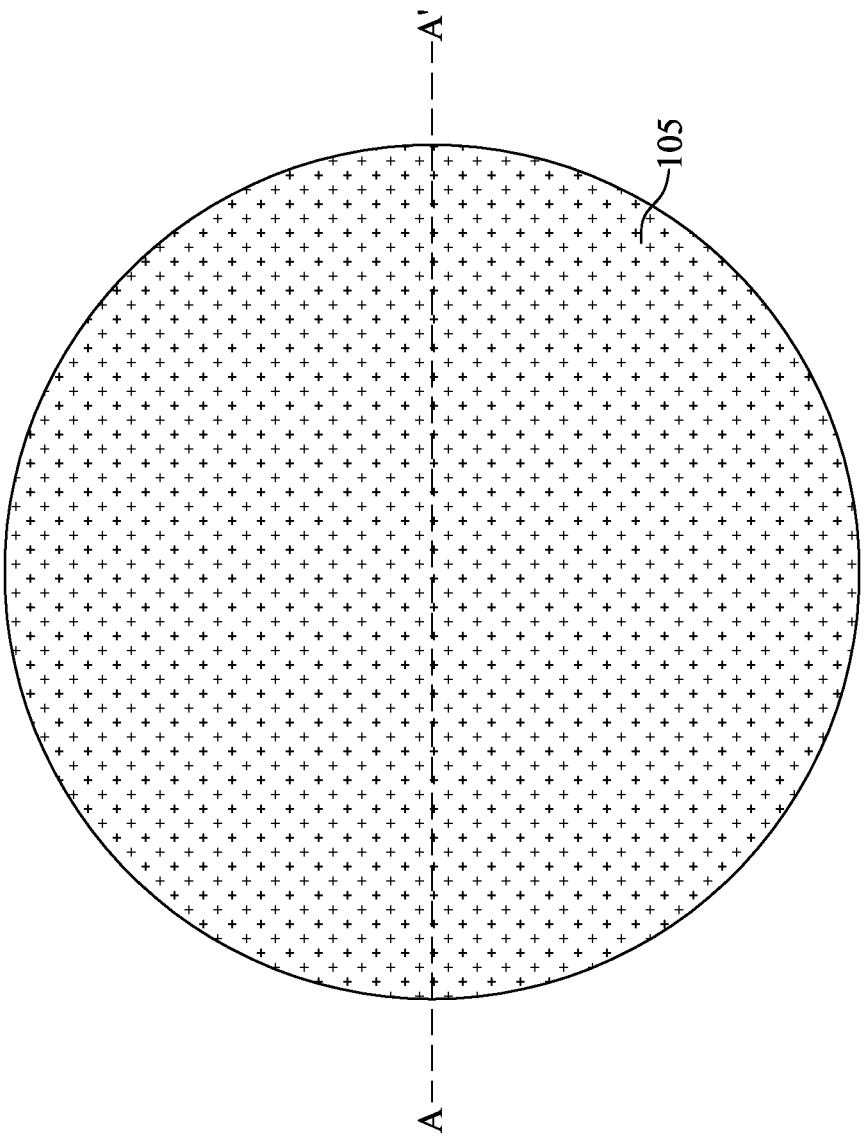
FIG. 3 is a top view illustrating an intermediate stage of sequentially forming a target layer and an energy-sensitive layer over a semiconductor substrate during the formation of the semiconductor device structure, in accordance with some embodiments.
Figure 4:
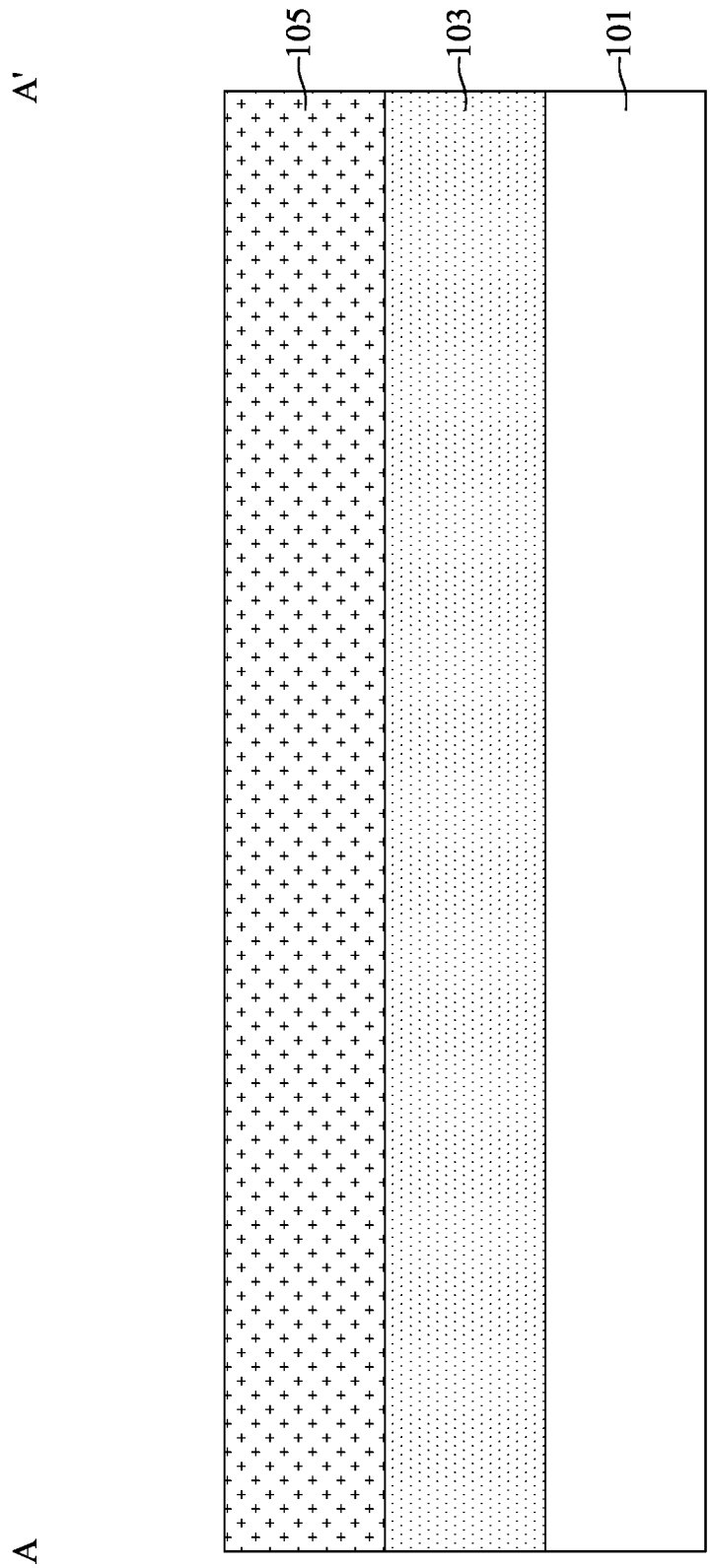
FIG. 4 is a cross-sectional view taken along line A-A' in FIG. 3, in accordance with some embodiments.

FIGS. 3-12 are top views and cross-sectional views illustrating various stages of forming the semiconductor device structure 100 (FIGS. 11 and 12) by the method 10 of FIG. 1, in accordance with some embodiments. As shown in FIGS. 3 and 4, a target layer 103 is formed over a semiconductor substrate 101, and an energy-sensitive layer 105 is formed over the target layer 103, in accordance with some embodiments. The respective steps are illustrated as the steps S11 and S13 in the method 10 shown in FIG. 1.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the target layer 103 includes a dielectric material, such as silicon oxide, silicon nitride, silicon oxynitride, a low-k dielectric material or another suitable material. However, any suitable materials may be utilized. In some embodiments, the target layer 103 is formed by a deposition process, such as a chemical vapor deposition (CVD) process, a physical vapor deposition (PVD) process, an atomic layer deposition (ALD) process, a spin-on coating process, or another suitable method.

Moreover, in some embodiments, the energy-sensitive layer 105 includes a cross-linking compound having a cross-linking functional group. In some embodiments, the cross-linking functional group includes a double bond. In some embodiments, the cross-linking compound has a hydrogen-bonding group, a polymerizable diacetylene group, or a combination thereof. Similar to the method for forming the target layer 103, the energy-sensitive layer 105 may be formed by a deposition process, such as a CVD process, a PVD process, an ALD process, a spin-on coating process, or another suitable method.

Figure 5:
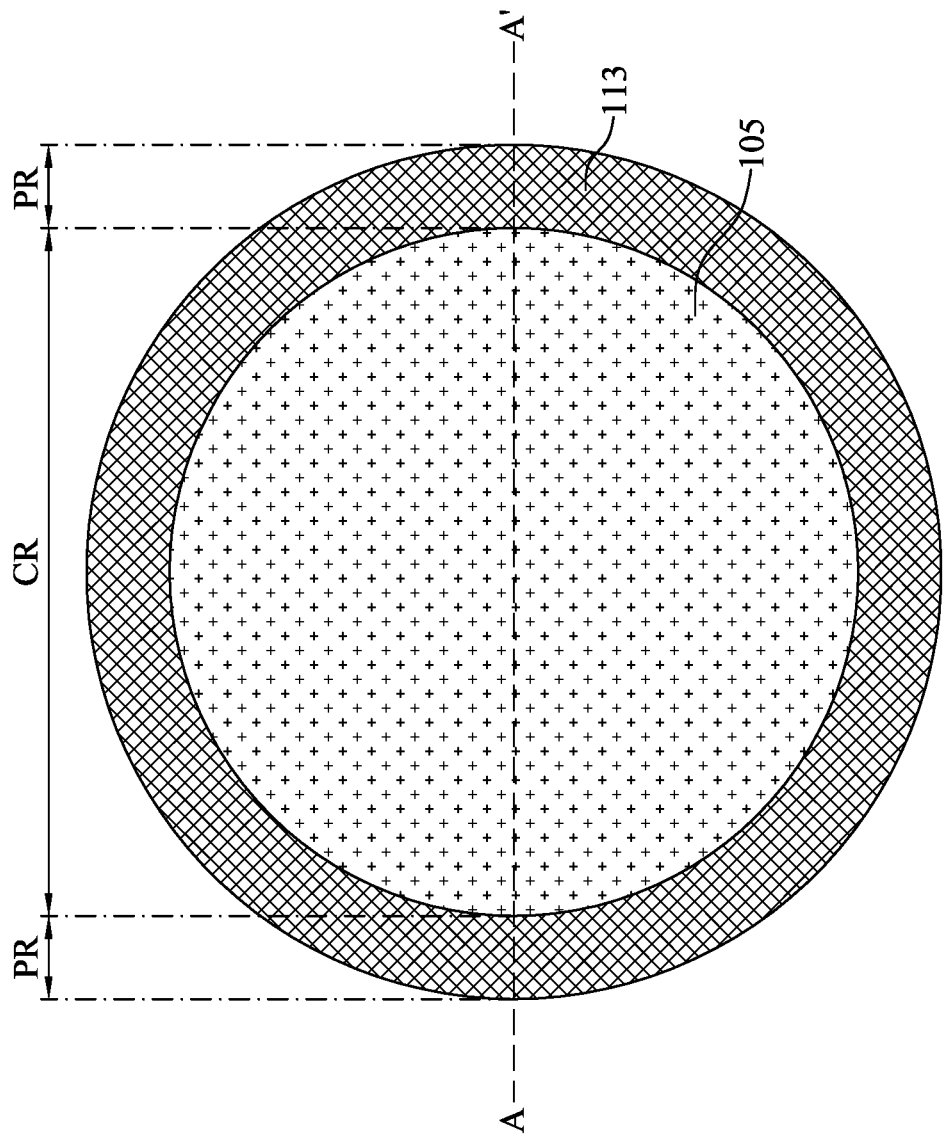
FIG. 5 is a top view illustrating an intermediate stage of performing an energy treating process to form a treated portion in the energy-sensitive layer during the formation of the semiconductor device structure, in accordance with some embodiments.
Figure 6:
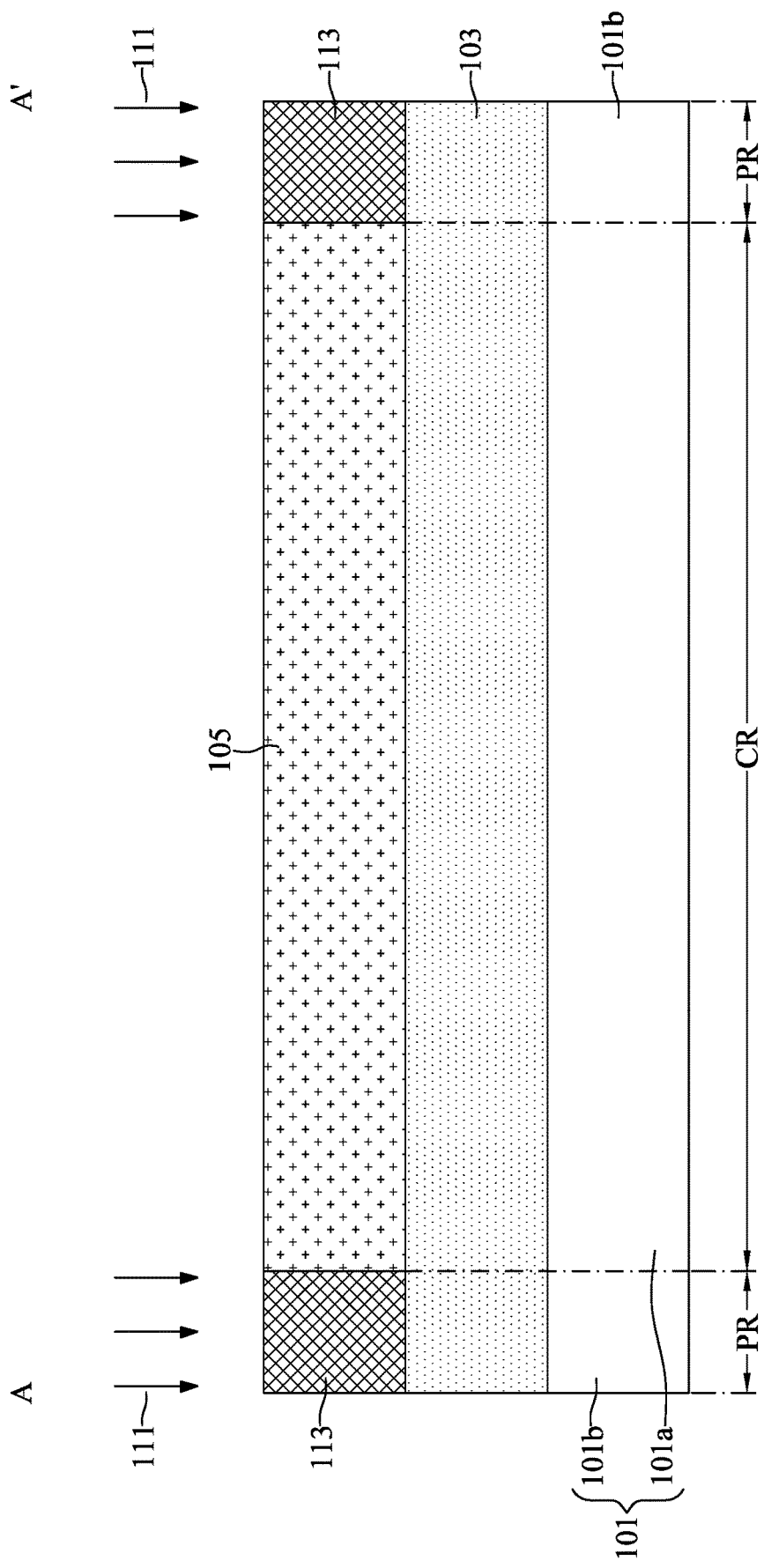
FIG. 6 is a cross-sectional view taken along line A-A' in FIG. 5, in accordance with some embodiments.

Next, an energy treating process 111 is performed to form a treated portion 113 in the energy-sensitive layer 105, as shown in FIGS. 5 and 6 in accordance with some embodiments. In some embodiments, the energy treating process 111 is performed on the portion of the energy-sensitive layer 105 in a peripheral region PR, such that the portion of the energy-sensitive layer 105 in the peripheral region PR is transformed into the treated portion 113, and an untreated portion of the energy-sensitive layer 105 is in a central region CR surrounded by the peripheral region PR. The respective step is illustrated as the step S15 in the method 10 shown in FIG. 1.

In some embodiments, the semiconductor substrate 101 includes a central portion 101a and a bevel portion 101b surrounding the central portion 101a. In some embodiments, the bevel portion 101b is a ring-shaped portion located adjacent the perimeter (i.e., outer edge) of the semiconductor substrate 101, and is typically provided to prevent chipping or facilitate easy handling of the semiconductor substrate 101. In some embodiments, the materials overlying the bevel portion 101b of the semiconductor substrate 101 may be designed to be removed in order to reduce defect and contamination risks generated during the subsequent processes.

It should be noted that the bevel portion 101b is covered by the treated portion 113. In some embodiments, the treated portion 113 overlaps the bevel portion 101b of the semiconductor substrate 101 in the top view. In some embodiments, the untreated portion of the energy-sensitive layer 105 does not overlap the bevel portion 101b of the semiconductor substrate 101 in the top view.

In addition, in some embodiments, the energy treating process 111 is an electron-beam (e-beam) writing process, where an e-beam is used as the energy source. However, other energy sources such as visible light, UV, DUV, EUV, X-ray, ion beam and the like may be used in the energy treating process 111. In some embodiments, the energy used in the energy treating process 111 is selected such that the treated portion 113 penetrates through the energy-sensitive layer 105. In other words, the height of the treated portion 113 is the same as the height of the energy-sensitive layer 105. In some embodiments, the treated portion 113 is formed to directly contact the underlying target layer 103.

Figure 7:
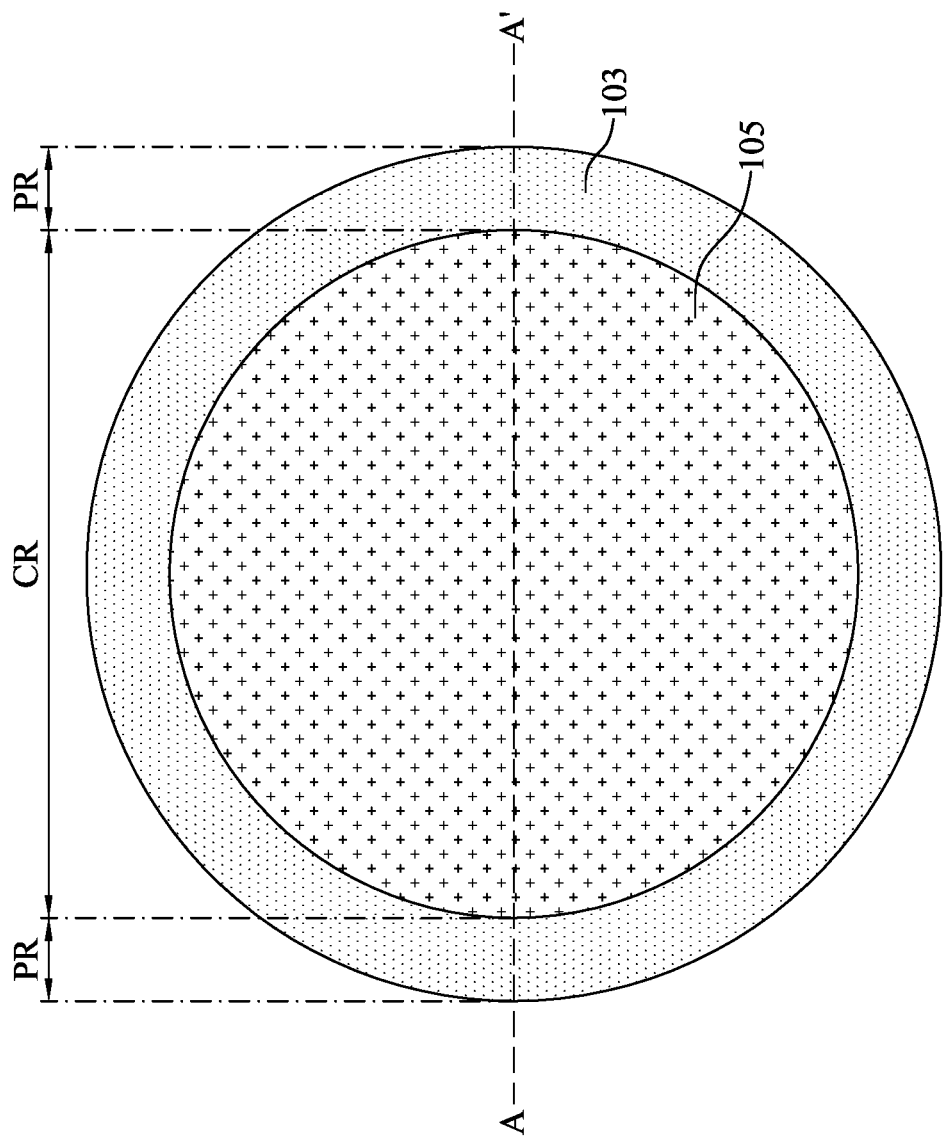
FIG. 7 is a top view illustrating an intermediate stage of removing the treated portion during the formation of the semiconductor device structure, in accordance with some embodiments.
Figure 8:
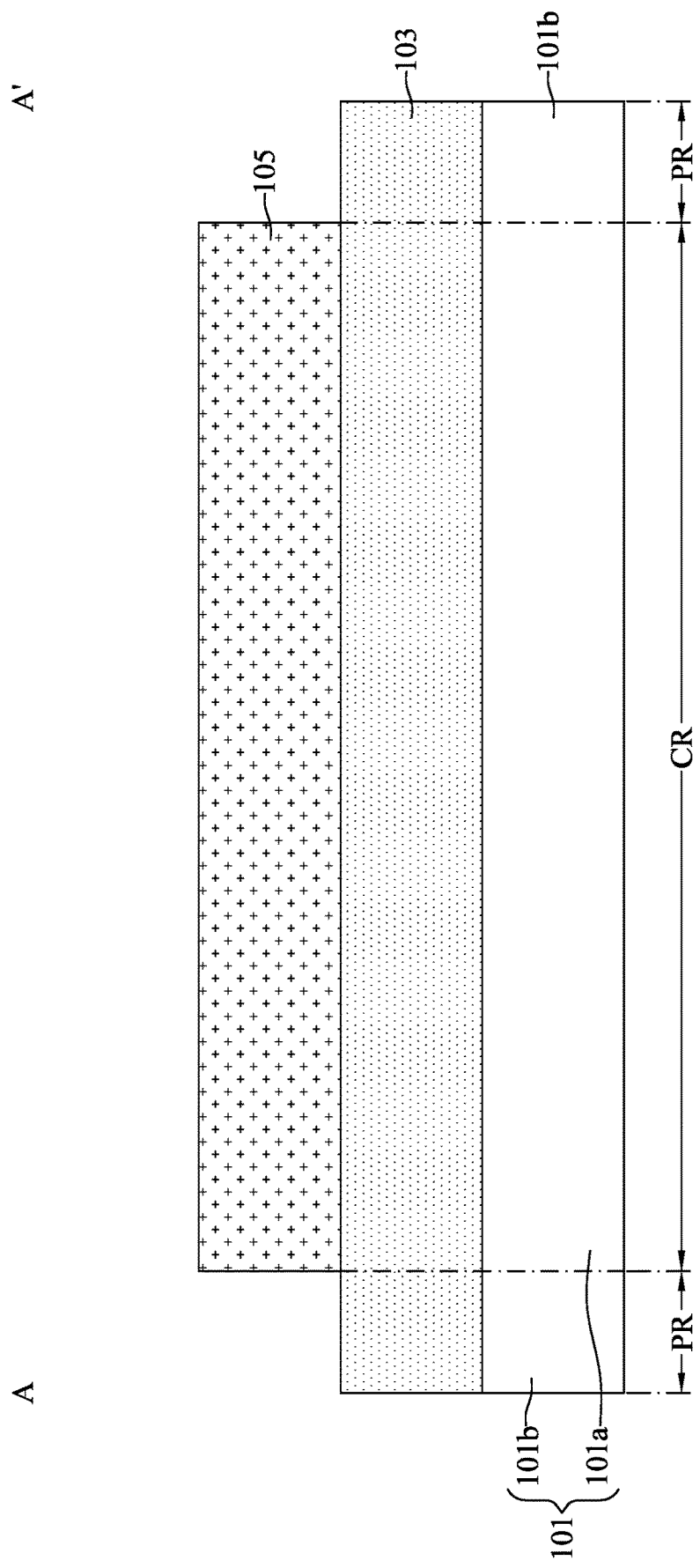
FIG. 8 is a cross-sectional view taken along line A-A' in FIG. 7, in accordance with some embodiments.

Subsequently, the treated portion 113 is removed to expose a portion of the target layer 103 in the peripheral region PR, as shown in FIGS. 7 and 8 in accordance with some embodiments. The respective step is illustrated as the step S17 in the method 10 shown in FIG. 1. In some embodiments, the treated portion 113 is removed by an etching process. The etching process may include a wet etching process, a dry etching process, or a combination thereof.

Figure 9:
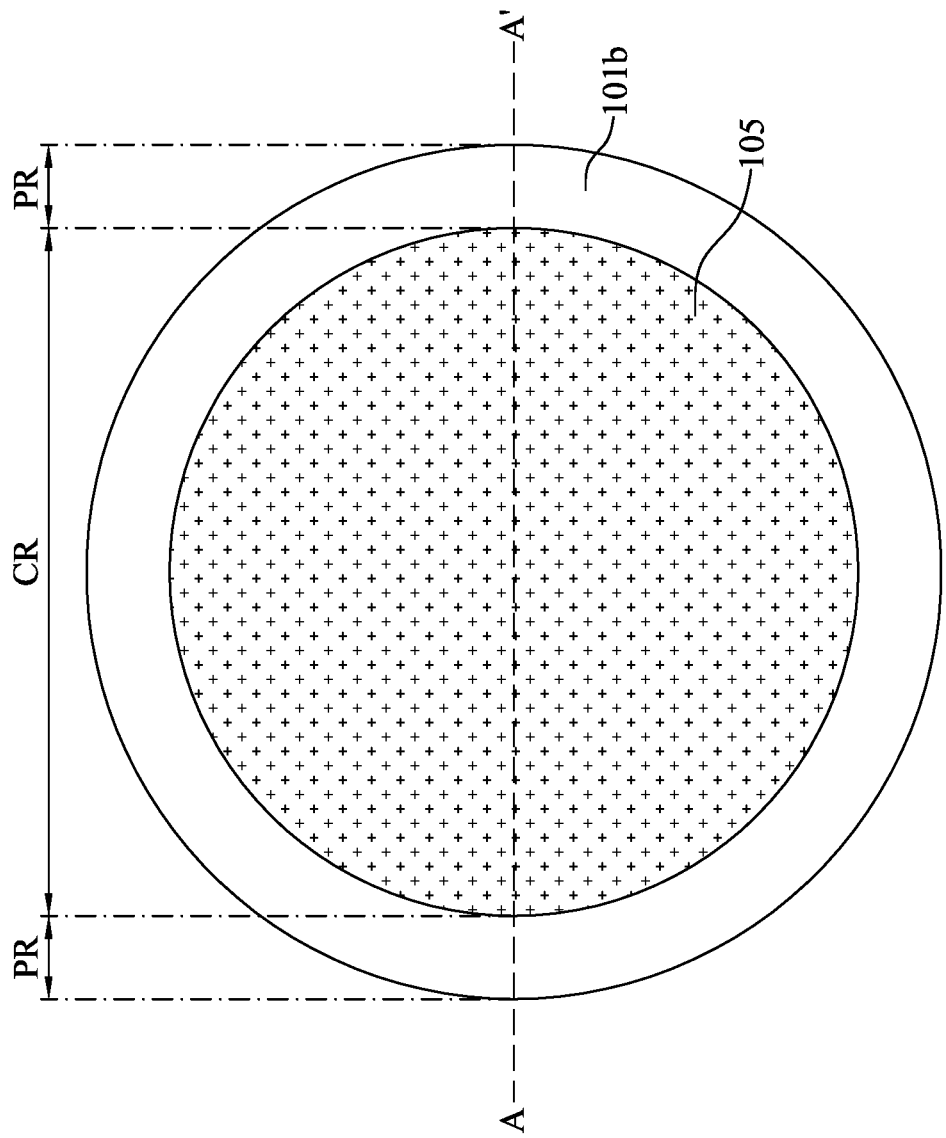
FIG. 9 is a top view illustrating an intermediate stage of transferring a remaining portion of the energy-sensitive layer to the target layer during the formation of the semiconductor device structure, in accordance with some embodiments.
Figure 10:
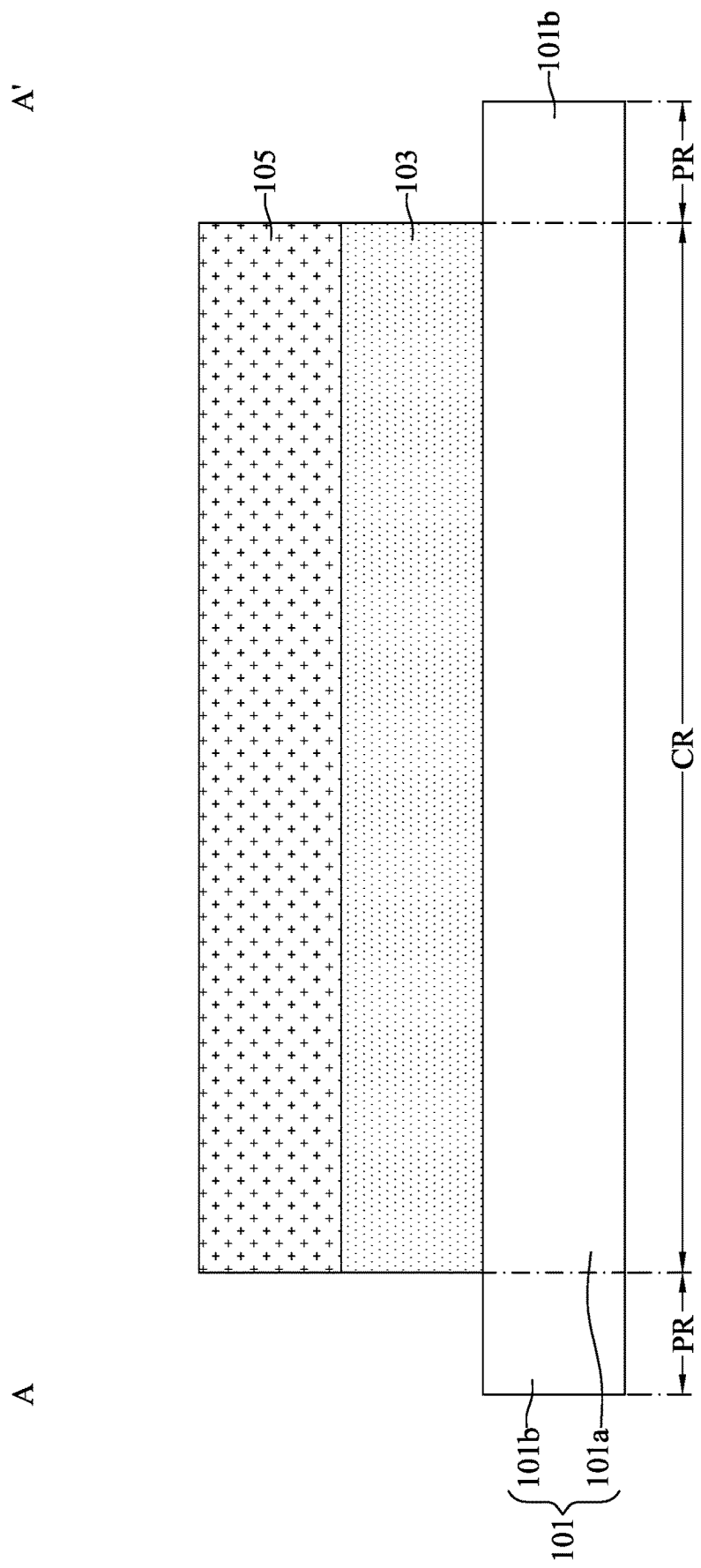
FIG. 10 is a cross-sectional view taken along line A-A' in FIG. 9, in accordance with some embodiments.

Then, the pattern of the remaining portion of the energy-sensitive layer 105 is transferred to the target layer 103, as shown in FIGS. 9 and 10 in accordance with some embodiments. The respective step is illustrated as the step S19 in the method 10 shown in FIG. 1. In some embodiments, the pattern of the remaining portion of the energy-sensitive layer 105 is transferred to the target layer 103 by an etching process. The etching process may include a wet etching process or a dry etching process.

Moreover, in some embodiments, the bevel portion 101b of the semiconductor substrate 101 is exposed after the target layer 103 is etched. In some embodiments, the central portion 101a of the semiconductor substrate 101 remains covered by the remaining portions of the target layer 103 and the energy-sensitive layer 105 after the target layer 103 is etched. In some embodiments, an anisotropic etching process is performed to remove the same amount of the materials vertically in all spaces. In this case, the remaining portion of the energy-sensitive layer 105 is removed during the process, in accordance with some embodiments. The anisotropic etching process may include a dry etching process.

Figure 11:
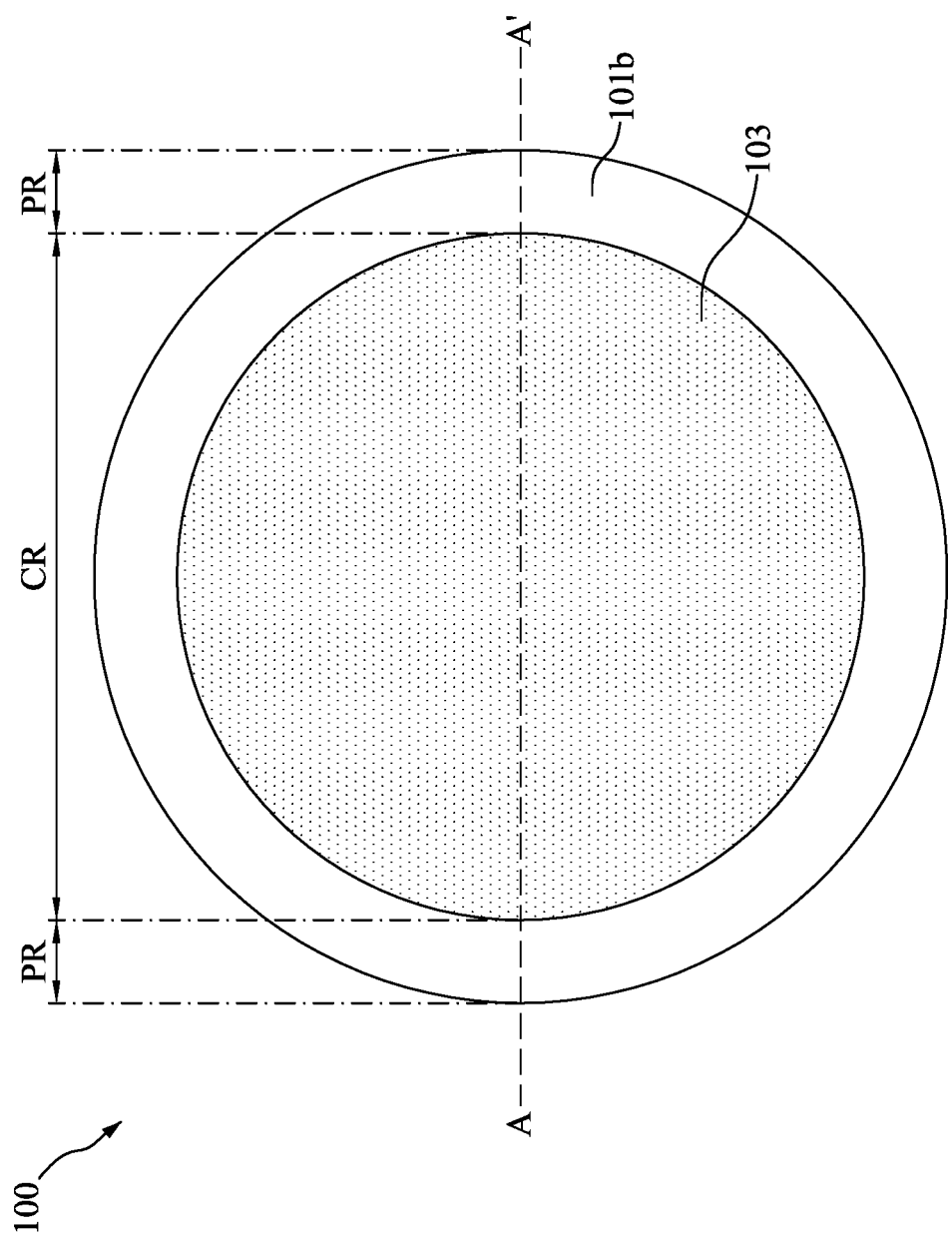
FIG. 11 is a top view illustrating an intermediate stage of removing the remaining portion of the energy-sensitive layer during the formation of the semiconductor device structure, in accordance with some embodiments.
Figure 12:
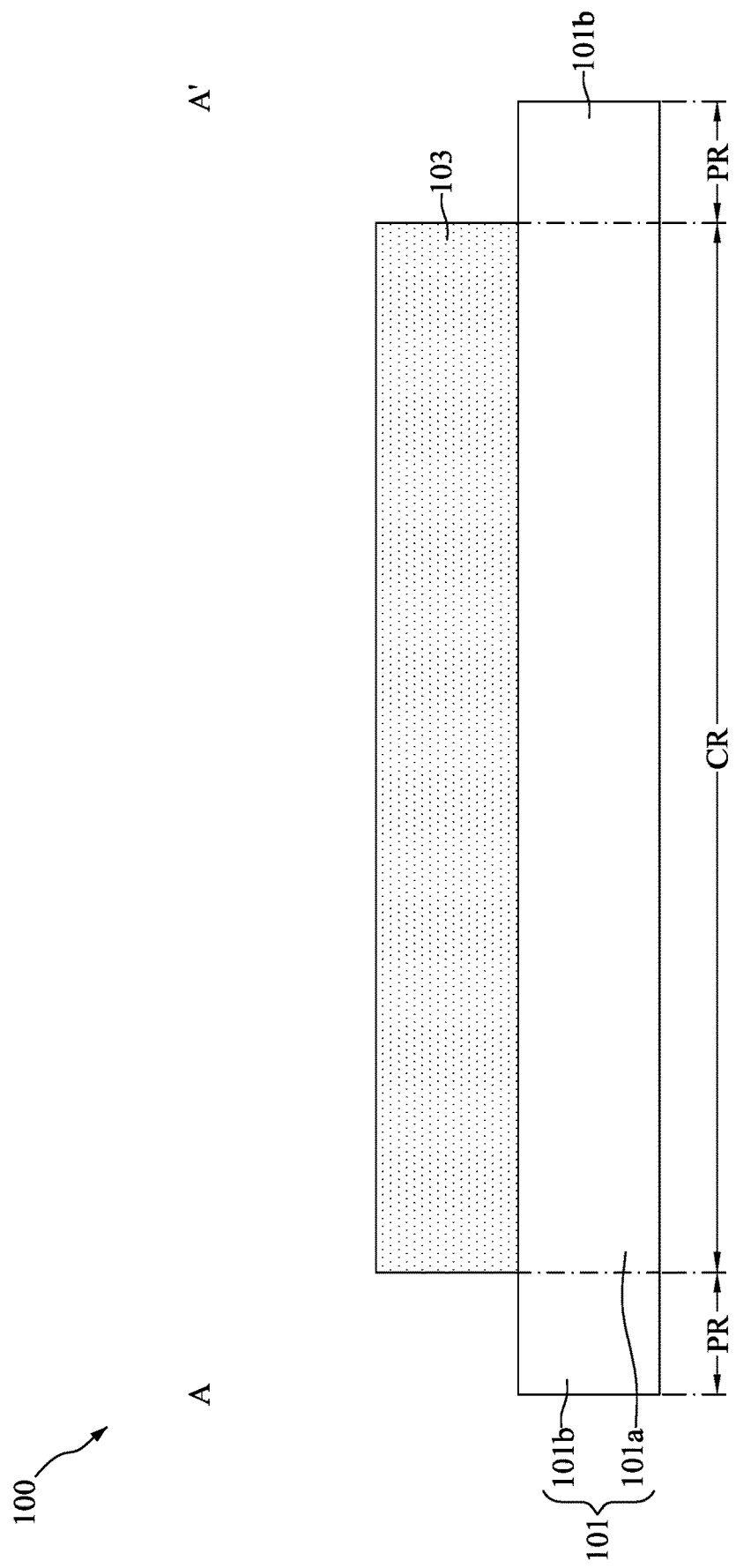
FIG. 12 is a cross-sectional view taken along line A-A' in FIG. 11, in accordance with some embodiments.

Next, if there is any remaining portion of the energy-sensitive layer 105 still exists, it may be removed, as shown in FIGS. 11 and 12 in accordance with some embodiments. In some embodiments, the energy-sensitive layer 105 is removed by an etching process (e.g., a wet etching process or a dry etching process), an ashing process, or a planarization process (e.g., a chemical mechanical polishing (CMP) process). After the energy-sensitive layer 105 is removed, the semiconductor device structure 100 is obtained.

Since the materials overlying the bevel portion 101a of the semiconductor substrate 101 are removed, the problem of undesired particles from the peeled and/or collapsed patterns reattached to the semiconductor substrate 101 can be eliminated, and defect and contamination risks generated during the subsequent processes may be reduced. As a result, the performance and the yield of the semiconductor device structure 100 can be improved.

Figure 13:
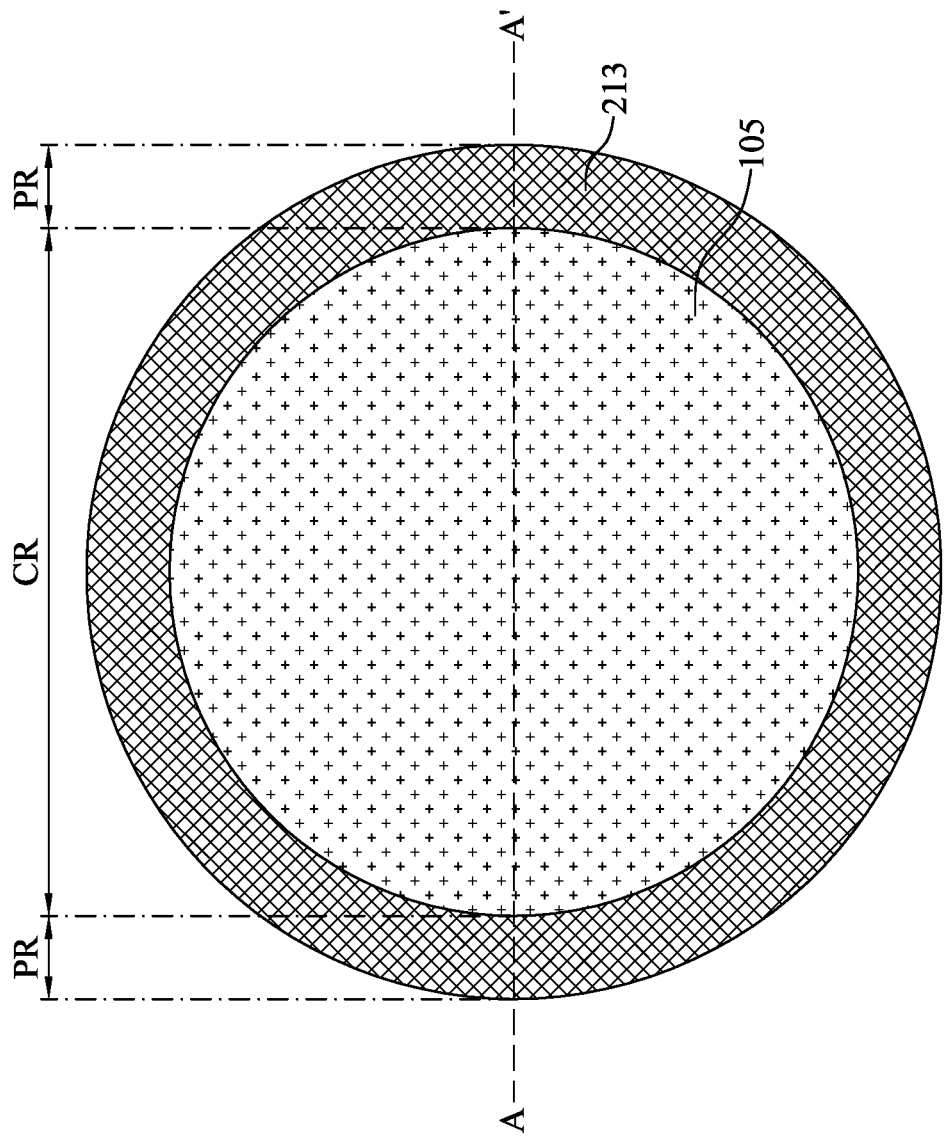
FIG. 13 is a top view illustrating an intermediate stage of performing an energy treating process to form a treated portion in the energy-sensitive layer during the formation of the semiconductor device structure, in accordance with some embodiments.
Figure 14:
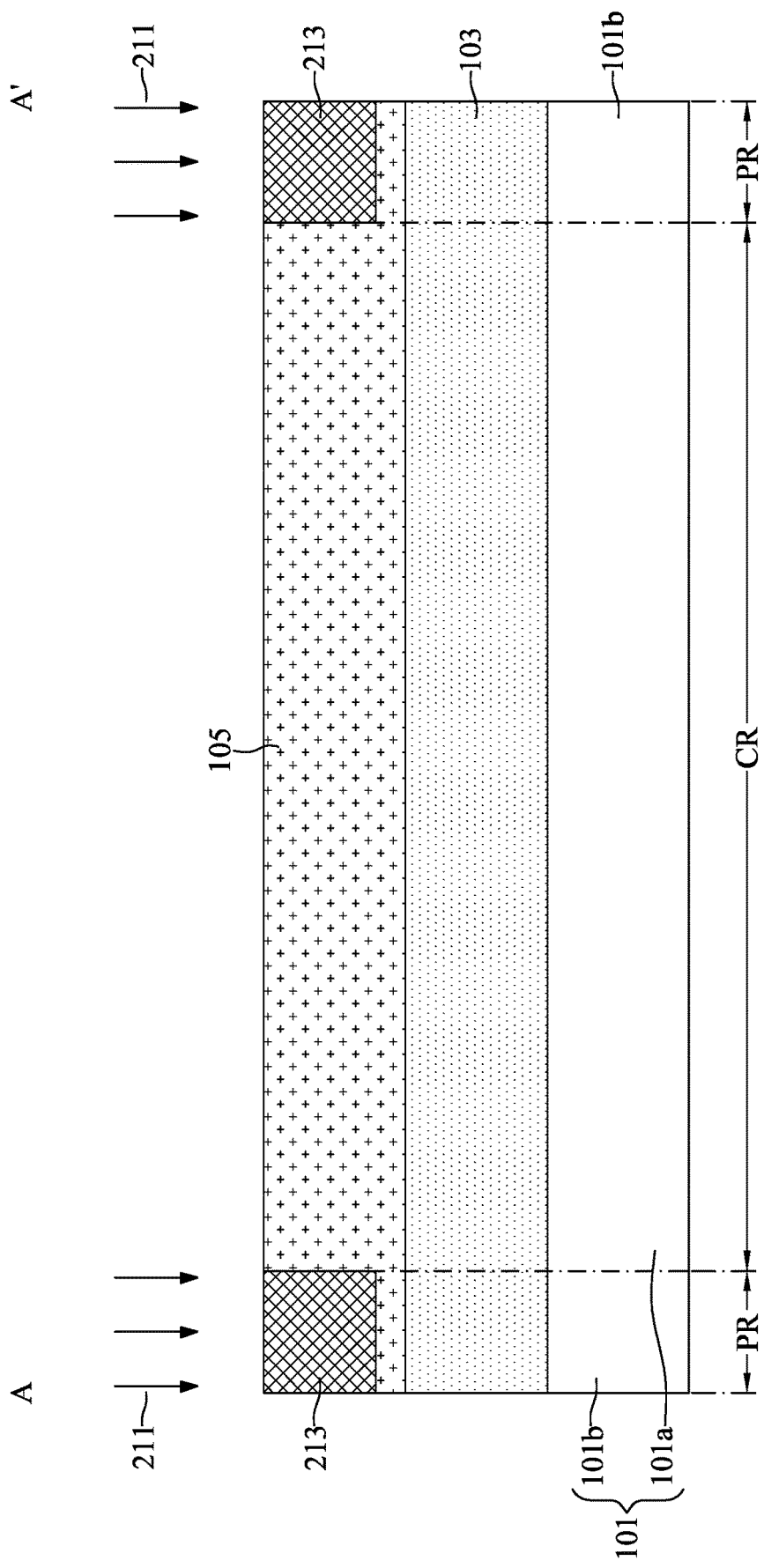
FIG. 14 is a cross-sectional view taken along line A-A' in FIG. 13, in accordance with some embodiments.
Figure 15:
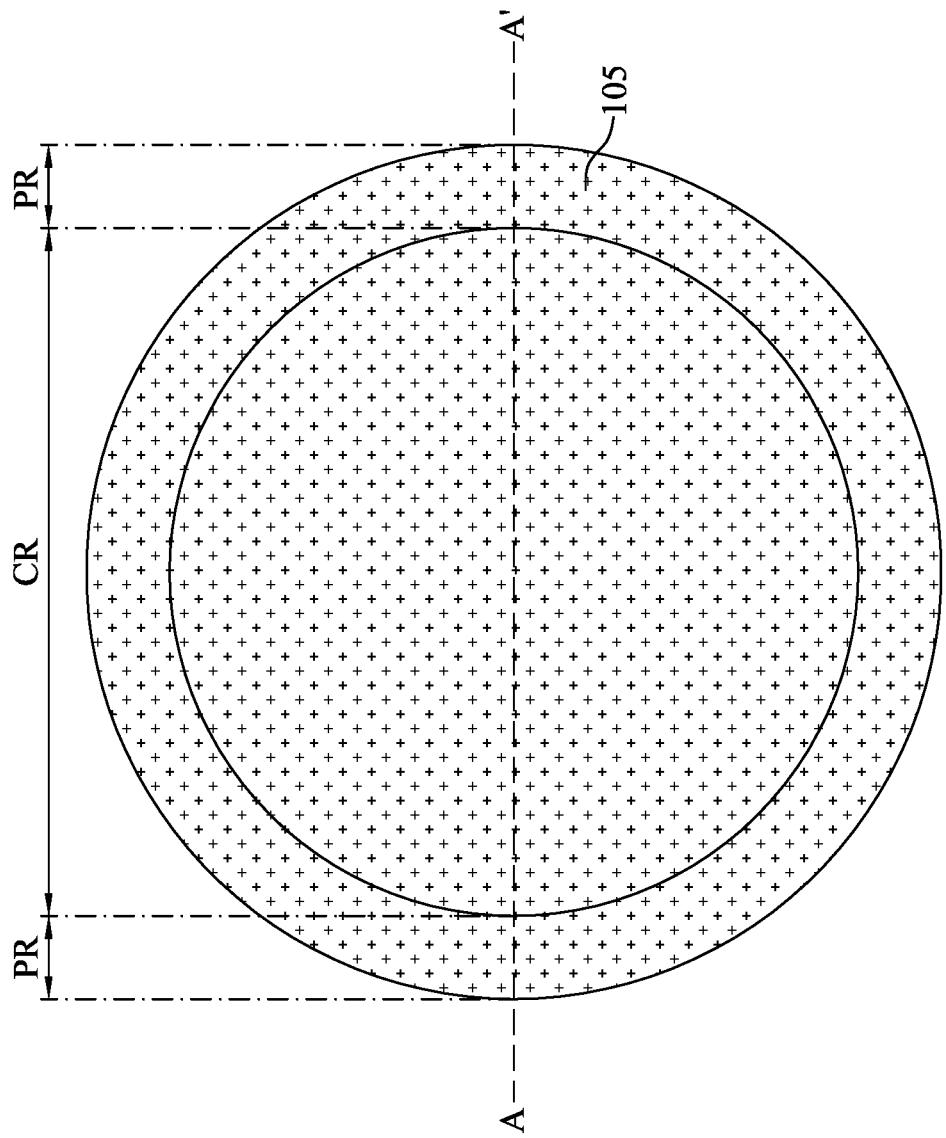
FIG. 15 is a top view illustrating an intermediate stage of removing the treated portion of the energy-sensitive layer during the formation of the semiconductor device structure in accordance with some embodiments.
Figure 16:
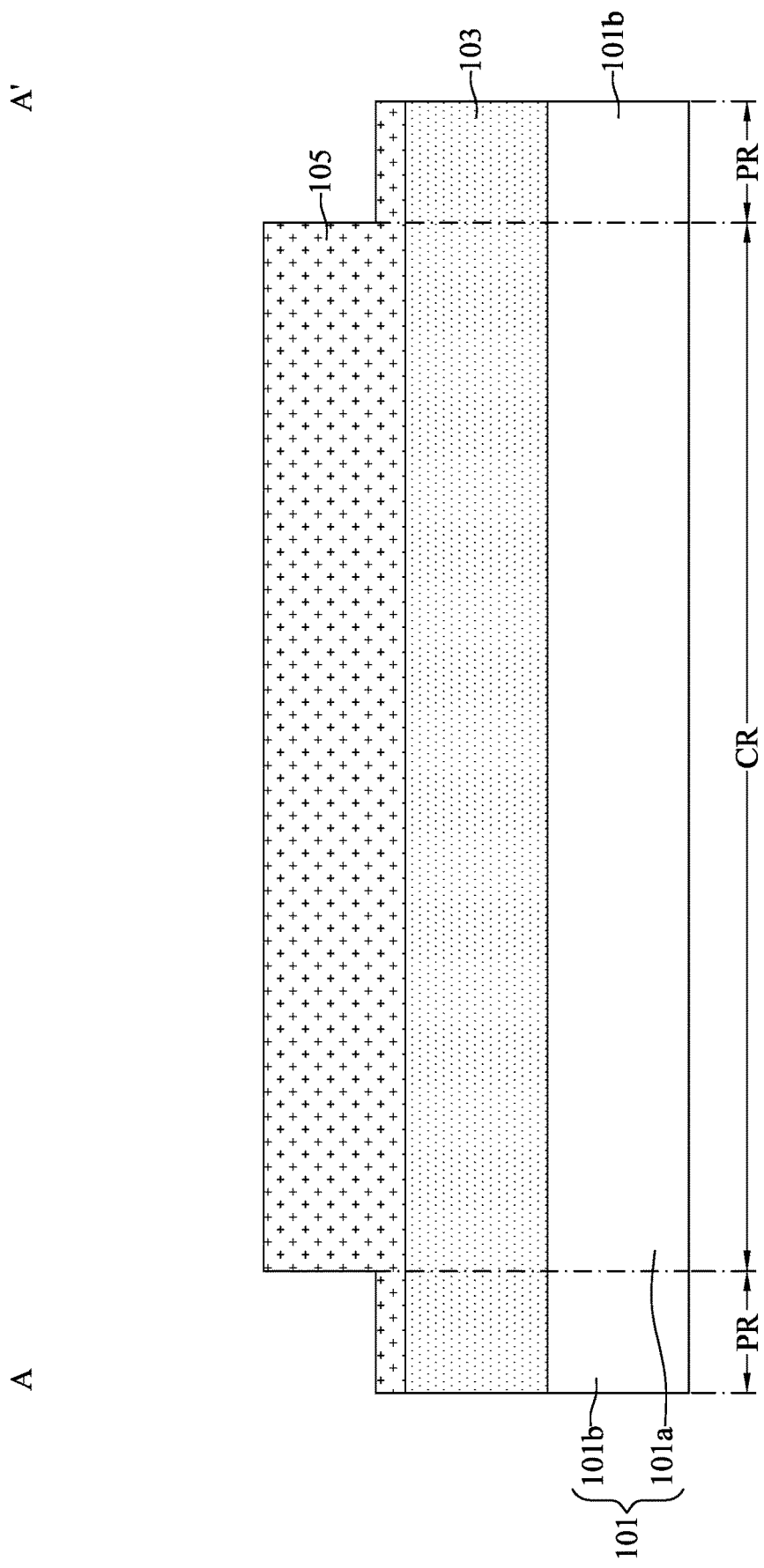
FIG. 16 is a cross-sectional view taken along line A-A' in FIG. 15, in accordance with some embodiments.

FIGS. 13 and 15 are top views illustrating intermediate stages of forming the semiconductor device structure 100 (FIGS. 11 and 12) by the method 10 of FIG. 1, in accordance with some other embodiments. FIGS. 14 and 16 are cross-sectional views taken along line A-A' in FIGS. 13 and 15, respectively, in accordance with some other embodiments.

Following the step of forming the energy-sensitive layer 105 (FIGS. 3 and 4), an energy treating process 211 is performed to form a treated portion 213 in the energy-sensitive layer 105, as shown in FIGS. 13 and 14 in accordance with some embodiments. In some embodiments, the energy treating process 211 is performed on the portion of the energy-sensitive layer 105 in the peripheral region PR covering the bevel portion 101b of the semiconductor substrate 101, such that the portion of the energy-sensitive layer 105 in the peripheral region PR is partially transformed into the treated portion 213. The respective step is illustrated as the step S15 in the method 10 shown in FIG. 1.

In some embodiments, the energy treating process 211 is an e-beam writing process, where an e-beam is used as the energy source. However, other energy sources such as visible light, UV, DUV, EUV, X-ray, ion beam and the like may be used in the energy treating process 211. In some embodiments, the energy used in the energy treating process 211 is selected such that the bottom surface of the treated portion 213 is higher than the top surface of the target layer 103. In other words, the treated portion 213 does not penetrate through the energy-sensitive layer 105.

Moreover, in some embodiments, the bottom surface of the treated portion 213 is higher than the bottom surface of the energy-sensitive layer 105 such that the height of the treated portion 213 is less than the height of the energy-sensitive layer 105. In some embodiments, the treated portion 213 is separated from the underlying target layer 103 by the untreated portion of the energy-sensitive layer 105. In some embodiments, the untreated portion of the energy-sensitive layer 105 mainly located in the central region CR surrounded by the peripheral region PR.

Subsequently, the treated portion 213 is removed, as shown in FIGS. 15 and 16 in accordance with some embodiments. The respective step is illustrated as the step S17 in the method 10 shown in FIG. 1. In some embodiments, the treated portion 213 is removed by an etching process. The etching process may include a wet etching process, a dry etching process, or a combination thereof.

In some embodiments, the portion of the target layer 103 in the peripheral region PR remains covered by the untreated portion of the energy-sensitive layer 105 after the treated portion 213 is removed. Then, one or more etching processes are performed on the structure of FIGS. 15 and 16 to expose the bevel portion 101b of the semiconductor substrate 101, such that the semiconductor device structure 100 is obtained as shown in FIGS. 11 and 12 in accordance with some embodiments. The respective step is illustrated as the step S19 in the method 10 shown in FIG. 1.

In some embodiments, one or more anisotropic etching processes are performed on the untreated portion of the energy-sensitive layer 105 and the target layer 103 to remove the same amount of the materials vertically in all spaces. The anisotropic etching process may include a dry etching process.

Since the materials overlying the bevel portion 101a of the semiconductor substrate 101 are removed, the problem of undesired particles from the peeled and/or collapsed patterns reattached to the semiconductor substrate 101 can be eliminated, and defect and contamination risks generated during the subsequent processes may be reduced. As a result, the performance and the yield of the semiconductor device structure 100 can be improved.

Figure 17:
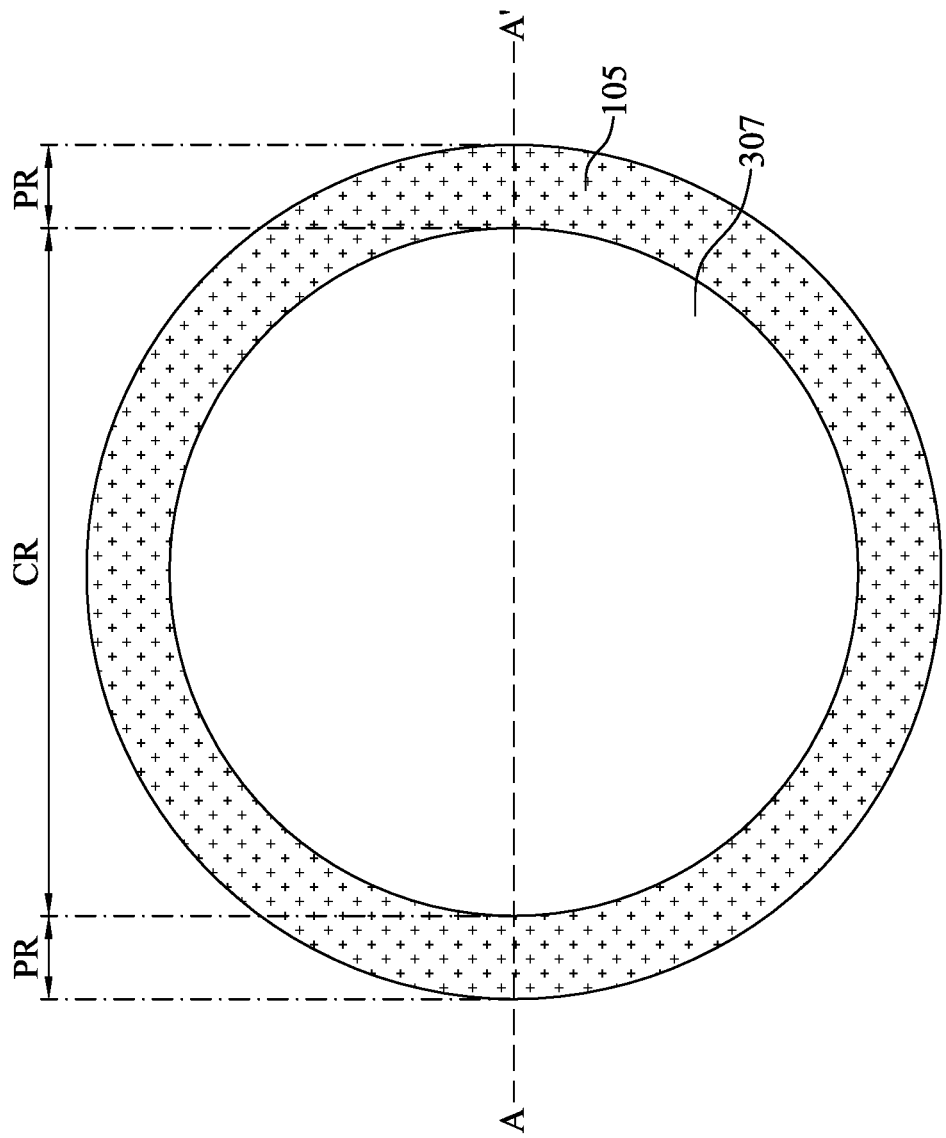
FIG. 17 is a top view illustrating an intermediate stage of forming a patterned hard mask over the energy-sensitive layer during the formation of the semiconductor device structure, in accordance with some embodiments.
Figure 19:
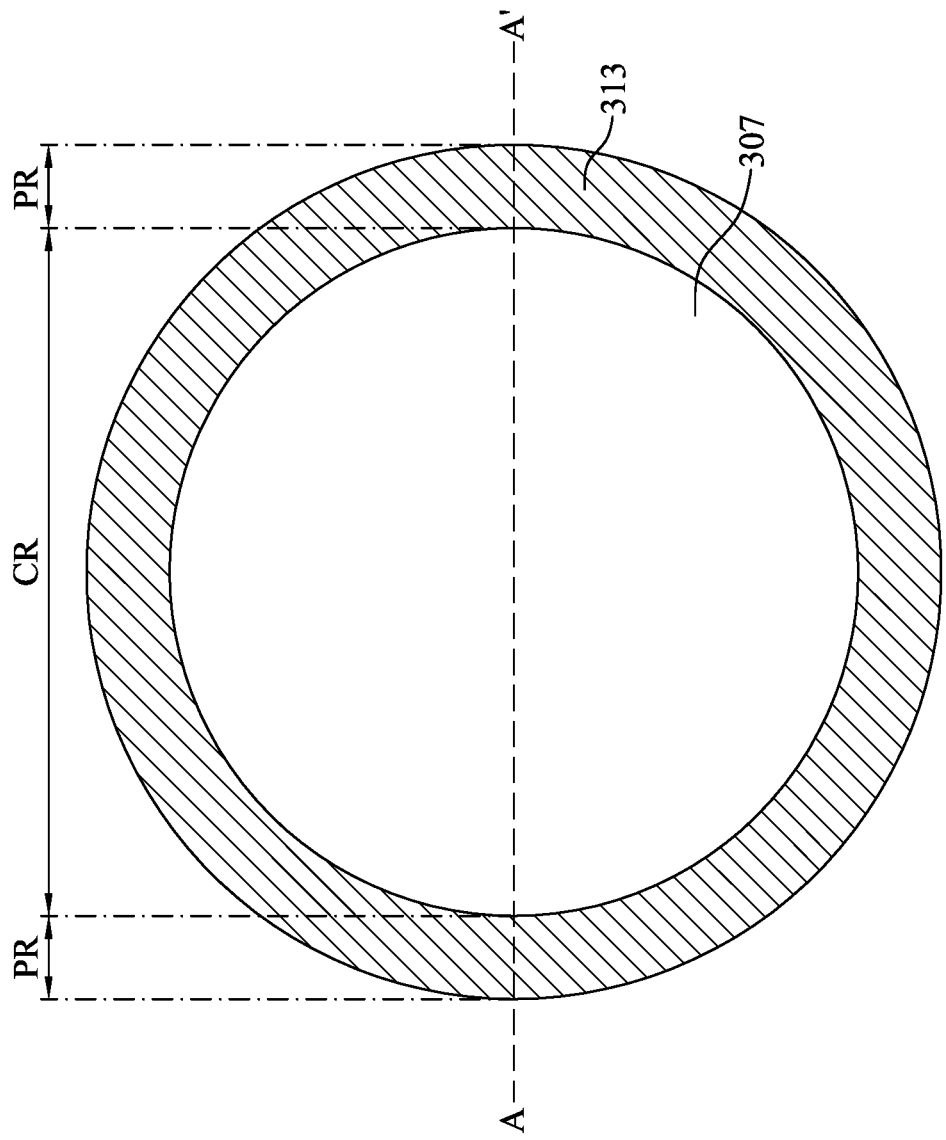
FIG. 19 is a top view illustrating an intermediate stage of performing an energy treating process using the patterned hard mask as a mask to form a treated portion in the energy-sensitive layer during the formation of the semiconductor device structure, in accordance with some embodiments.

FIGS. 17 and 19 are top views illustrating intermediate stages of forming the semiconductor device structure 100

Figure 18:
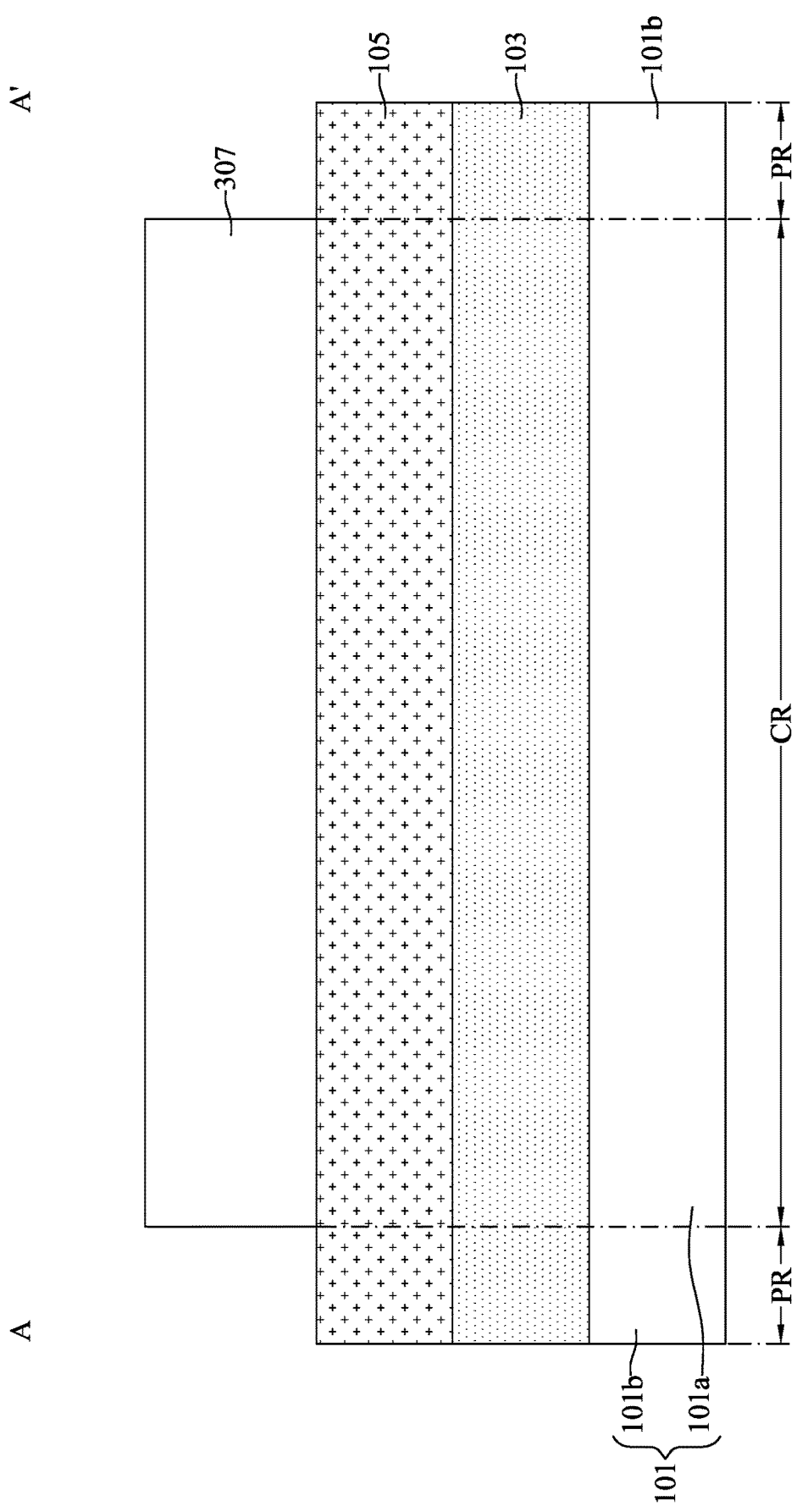
FIG. 18 is a cross-sectional view taken along line A-A' in FIG. 17, in accordance with some embodiments.
Figure 20:
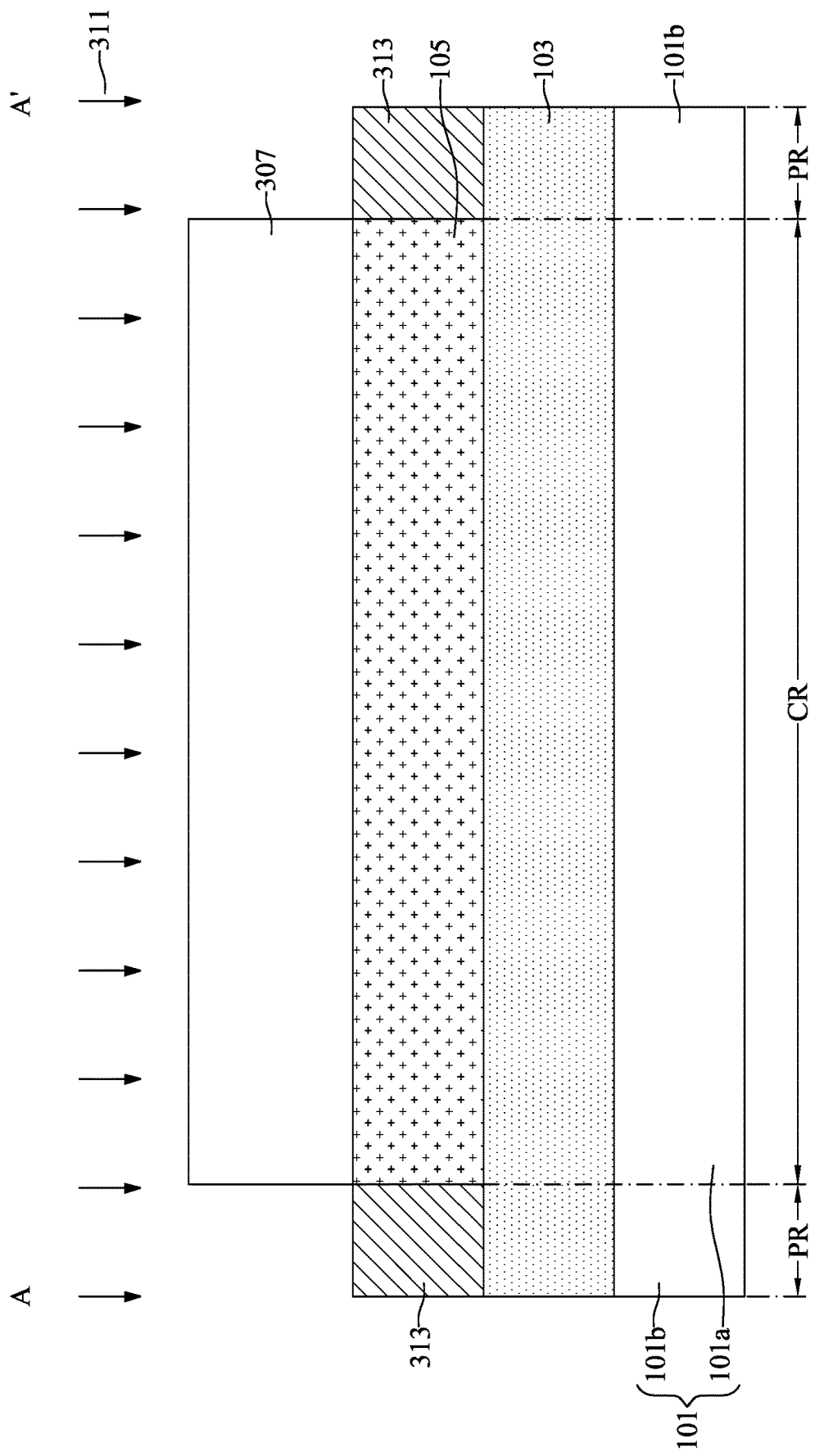
FIG. 20 is a cross-sectional view taken along line A-A' in FIG. 19, in accordance with some embodiments.

(FIGS. 11 and 12) by the method 30 of FIG. 2, in accordance with some other embodiments. FIGS. 18 and 20 are cross-sectional views taken along line A-A' in FIGS. 17 and 19, respectively, in accordance with some other embodiments.

Following the step of forming the energy-sensitive layer 105 (shown in FIGS. 3 and 4, corresponding to the steps S31 and S33 in the method 30 shown in FIG. 2), a patterned hard mask 307 is formed over the energy-sensitive layer 105, as shown in FIGS. 17 and 18 in accordance with some embodiments. The respective step is illustrated as the step S35 in the method 30 shown in FIG. 2. The patterned hard mask 307 may be formed by a procedure including a deposition process and a subsequent patterning process. In some embodiments, the patterned hard mask 307 includes silicon oxide, silicon nitride, silicon oxynitride, silicon oxycarbide, silicon carbon nitride, metal oxide, or another suitable material.

In some embodiments, the patterned hard mask 307 is formed in the central region CR. In some embodiments, the portion of the energy-sensitive layer 105 in the peripheral region PR is exposed by the patterned hard mask 307. In some embodiments, the patterned hard mask 307 does not overlaps the bevel portion 101b of the semiconductor substrate 101 in the top view. Moreover, the patterned hard mask 307 functions as a mask for a subsequent energy treating process, in accordance with some embodiments.

Next, an energy treating process 311 is performed to form a treated portion 313 in the energy-sensitive layer 105, as shown in FIGS. 19 and 20 in accordance with some embodiments. In some embodiments, the energy treating process 311 is performed on the energy-sensitive layer 105 using the patterned hard mask 307 as a mask, such that the portion of the energy-sensitive layer 105 in the peripheral region PR is transformed into the treated portion 313. The respective step is illustrated as the step S37 in the method 10 shown in FIG. 1.

In this case, the energy source of the energy treating process 311 may be visible light, ultraviolet (UV), deep ultraviolet (DUV), extreme ultraviolet (EUV), or X-ray. If the energy source is an e-beam or an ion beam, the formation of the patterned hard mask 307 may be omitted. In some embodiments, the bevel portion 101b of the semiconductor substrate 101 is covered by the treated portion 313. In some embodiments, the treated portion 313 overlaps the bevel portion 101b of the semiconductor substrate 101 in the top view. In some embodiments, the untreated portion of the energy-sensitive layer 105 does not overlap the bevel portion 101b of the semiconductor substrate 101 in the top view.

In addition, in some embodiments, the energy used in the energy treating process 311 is selected such that the treated portion 313 penetrates through the energy-sensitive layer 105. In other words, the height of the treated portion 313 is the same as the height of the energy-sensitive layer 105. In some embodiments, the treated portion 313 is formed to directly contact the underlying target layer 103.

After the treated portion 313 is formed, the patterned hard mask 307 and the treated portion 313 may be removed. The respective step is illustrated as the step S39 in the method 30 shown in FIG. 2. For example, the treated portion 313 and the patterned hard mask 307 may be removed by etching, ashing, or combinations thereof. The etching process may include a wet etching process, a dry etching process, or a combination thereof. The patterned hard mask 307 and the treated portion 313 may be removed separately or may be removed by the same process.

Subsequently, the pattern of the remaining portion (i.e., the untreated portion) of the energy-sensitive layer 105 is transferred to the target layer 103, as shown in FIGS. 9 and 10 in accordance with some embodiments. The respective step is illustrated as the step S41 in the method 30 shown in FIG. 2. In some embodiments, the pattern is transferred by a dry etching process.

Moreover, in some embodiments, the bevel portion 101b of the semiconductor substrate 101 is exposed after the target layer 103 is etched. In some embodiments, the central portion 101a of the semiconductor substrate 101 remains covered by the remaining portions of the target layer 103 and the energy-sensitive layer 105 after the target layer 103 is etched. Then, the remaining portion of the energy-sensitive layer 105 may be removed, such that the semiconductor device structure 100 is obtained, as shown in FIGS. 11 and 12 in accordance with some embodiments.

Embodiments of the method for preparing a semiconductor device structure including bevel etching process are provided in the disclosure. The method includes sequentially forming a target layer (e.g., the target layer 103) and an energy-sensitive layer (e.g., the energy-sensitive layer 105) over a semiconductor substrate (e.g., the semiconductor substrate 101), and forming a treated portion (e.g., the treated portions 113, 213 and 313) in the energy-sensitive layer by performing an energy treating process (e.g., the energy treating processes 111, 211 and 311). The method also includes removing the treated portion and transferring a pattern of a remaining portion of the energy-sensitive layer to the target layer. In some embodiments, the treated portion of the energy-sensitive layer is in a peripheral region, and the remaining portion of the energy-sensitive layer is in a central region. Therefore, the materials directly over the bevel portion of the semiconductor substrate (i.e., the portion of the semiconductor substrate in the peripheral region) can be removed.

Since the materials overlying the bevel portion of the semiconductor substrate are removed, the problem of undesired particles from the peeled and/or collapsed patterns reattached to the semiconductor substrate can be eliminated, and defect and contamination risks generated during the subsequent processes may be reduced. As a result, the performance and the yield of the semiconductor device structure can be improved.

In one embodiment of the present disclosure, a method for preparing a semiconductor device structure is provided. The method includes forming a target layer over a semiconductor substrate, and forming an energy-sensitive layer over the target layer. The method also includes performing an energy treating process to form a treated portion in the energy-sensitive layer. The treated portion is in a peripheral region. The method further includes removing the treated portion such that a remaining portion of the energy-sensitive layer is in a central region surrounded by the peripheral region, and transferring a pattern of the remaining portion of the energy-sensitive layer to the target layer.

In another embodiment of the present disclosure, a method for preparing a semiconductor device structure is provided. The method includes forming a target layer over a semiconductor substrate, and forming an energy-sensitive layer over the target layer. The method also includes performing an energy treating process on the energy-sensitive layer to transform a portion of the energy-sensitive layer into a treated portion. An untreated portion of the energy-sensitive layer is surrounded by the treated portion. The method further includes removing the treated portion, and transferring a pattern of the untreated portion of the energy-sensitive layer to the target layer such that the semiconductor substrate is exposed.

The embodiments of the present disclosure have some advantageous features. By forming a treated portion in the peripheral region of the energy-sensitive layer, the materials over the bevel portion of the semiconductor substrate can be removed. As a result, the performance and the yield of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A bevel etching method, comprising:

forming a target layer over a semiconductor substrate which has a central portion and a bevel portion, wherein the target layer has a central portion covering the central portion of the semiconductor substrate and a peripheral portion covering the bevel portion of the semiconductor substrate;

forming an energy-sensitive layer over the target layer, wherein a diameter of the energy-sensitive layer is equal to a diameter of the target layer and is equal to a diameter of the semiconductor substrate, such that the energy-sensitive layer has a central region covering the central portion of the target layer and a peripheral region covering the peripheral portion of the target layer;

performing an energy treating process to form a treated portion in the energy-sensitive layer, wherein the treated portion is in the peripheral region of the energy-sensitive layer;

removing the treated portion of the energy-sensitive layer to reduce the diameter of the energy-sensitive layer while the diameters of the target layer and the semiconductor substrate are remained unchanged, such that a remaining portion of the energy-sensitive layer is kept and retained in the central region surrounded by the peripheral region, wherein the treated portion of the energy-sensitive layer is removed to expose the peripheral portion of the target layer while the bevel portion of the semiconductor substrate is covered by the peripheral portion of the target layer, such that the diameter of the energy-sensitive layer is reduced after the energy treating process by removing the peripheral region of the energy-sensitive layer; and transferring a pattern of the remaining portion of the energy-sensitive layer to the target layer by an etching process, wherein after the etching process, the diameter of the target layer is reduced to be equal to the diameter of the energy-sensitive layer after the energy treating process, while the diameter of the semiconductor substrate is remained unchanged, such that the bevel portion of the semiconductor substrate is exposed while the central portion of the semiconductor substrate is remained covered by the target layer, wherein a height of the semiconductor substrate is remained unchanged before and after the energy treating process and the etching process, such that a height of the bevel portion of the semiconductor substrate is equal to a height of the central portion thereof.

2. The bevel etching method of claim 1, wherein the bevel portion of the semiconductor substrate is covered by the treated portion before the energy treating process.

3. The bevel etching method of claim 2, wherein a diameter of the remaining portion of the energy-sensitive layer is equal to a diameter of the target layer after the target layer is etched.

4. The bevel etching method of claim 1, wherein the energy-sensitive layer includes a cross-linking compound having a cross-linking functional group.

5. The bevel etching method of claim 4, wherein the cross-linking functional group includes a double bond.

6. The bevel etching method of claim 1, wherein the treated portion is in direct contact with the target layer, wherein the central portion of the target layer is covered by the remaining portion of the energy-sensitive layer after the treated portion is removed.

7. The bevel etching method of claim 1, wherein the diameters of the energy-sensitive layer, the target layer, and the semiconductor substrate are equal before the energy treating process is performed.

8. The bevel etching method of claim 1, wherein the pattern of the remaining portion of the energy-sensitive layer is transferred to the target layer by a dry etching process.

9. The bevel etching method of claim 1, further comprising:

removing the remaining portion of the energy-sensitive layer after the pattern of the remaining portion of the energy-sensitive layer is transferred to the target layer.

10. The bevel etching method of claim 1, wherein the energy treating process is an electron-beam (e-beam) writing process.

* * * * *